US012667014B2

(12) United States Patent
Chen

(10) Patent No.: US 12,667,014 B2
(45) Date of Patent: Jun. 23, 2026

(54) PACKAGE STRUCTURE AND PACKAGING METHOD

(71) Applicant: CHANGXIN MEMORY TECHNOLOGIES, INC., Hefei City (CN)

(72) Inventor: Xiaoxuan Chen, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 592 days.

(21) Appl. No.: 18/169,175

(22) Filed: Feb. 14, 2023

(65) Prior Publication Data

US 2023/0197652 A1     Jun. 22, 2023

Related U.S. Application Data

(63) Continuation of application No. PCT/CN2022/071095, filed on Jan. 10, 2022.

(30) Foreign Application Priority Data

Sep. 30, 2021    (CN) .......................... 202111165993.4

(51) Int. Cl.
| | |
|---|---|
| *H10W 90/00* | (2026.01) |
| *H10W 72/00* | (2026.01) |
| *H10W 72/90* | (2026.01) |
| *H10W 80/00* | (2026.01) |
| *H10W 90/20* | (2026.01) |

(52) U.S. Cl.
CPC ...... *H10W 90/00* (2026.01); *H10W 72/01904* (2026.01); *H10W 72/01951* (2026.01);
(Continued)

(58) Field of Classification Search
CPC . H10W 90/00; H10W 90/297; H10W 90/792; H10W 72/01904;
(Continued)

(56) References Cited

U.S. PATENT DOCUMENTS

| | | |
|---|---|---|
| 7,453,150 B1 | 11/2008 | McDonald |
| 7,642,173 B2 | 1/2010 | McDonald |

(Continued)

FOREIGN PATENT DOCUMENTS

| | | |
|---|---|---|
| CN | 103296014 A | 9/2013 |
| CN | 103377995 A | 10/2013 |

(Continued)

*Primary Examiner* — Dao H Nguyen
(74) *Attorney, Agent, or Firm* — Syncoda LLC; Feng Ma

(57) ABSTRACT

A package structure includes at least two semiconductor structures that are stacked onto one another. The first surface of one semiconductor structure of the at least two semiconductor structures that are stacked onto one another directly faces toward the second surface of another semiconductor structure of the at least two semiconductor structures which is adjacent to said one semiconductor structure; the first metal layer of said one semiconductor structure is in contact with and bonded to the third metal layer of said another semiconductor structure; and the second metal layer of said one semiconductor structure is in contact with and bonded to the fourth metal layer of said another semiconductor structure.

11 Claims, 13 Drawing Sheets

(52) U.S. Cl.
   CPC ........ *H10W 72/926* (2026.01); *H10W 72/932*
       (2026.01); *H10W 72/942* (2026.01); *H10W
       72/944* (2026.01); *H10W 72/9445* (2026.01);
       *H10W 72/952* (2026.01); *H10W 72/965*
       (2026.01); *H10W 72/967* (2026.01); *H10W
       80/331* (2026.01); *H10W 90/297* (2026.01);
       *H10W 90/792* (2026.01)

(58) Field of Classification Search
   CPC ........ H10W 72/01951; H10W 72/926; H10W
       72/932; H10W 72/942; H10W 72/944;
       H10W 72/9445; H10W 72/952; H10W
       72/965; H10W 72/967; H10W 72/019;
       H10W 72/20; H10W 72/90; H10W
       80/331; H10W 20/20; H10W 40/22;
       H10W 40/25; H10W 74/01; H10W 74/10;
       H01L 24/08; H01L 24/80; H01L 24/09;
       H01L 2225/06565; H01L 2225/06589;
       H01L 2225/06541; H01L 25/0657; H01L
       25/50
   See application file for complete search history.

(56)                  References Cited

U.S. PATENT DOCUMENTS

|  |  |  |  |  |
|---|---|---|---|---|
| 8,698,321 | B2 * | 4/2014 | Suh | H01L 25/0657 |
|  |  |  |  | 257/E23.141 |
| 9,941,241 | B2 | 4/2018 | Edelstein |  |
| 10,157,894 | B2 * | 12/2018 | Koyanagi | H01L 23/50 |
| 10,297,569 | B2 | 5/2019 | Edelstein |  |
| 11,569,250 | B2 * | 1/2023 | Young | H01L 21/02565 |
| 2008/0220565 | A1 * | 9/2008 | Hsu | H01L 25/50 |
|  |  |  |  | 438/109 |
| 2009/0042365 | A1 | 2/2009 | McDonald |  |
| 2018/0005978 | A1 | 1/2018 | Edelstein et al. |  |
| 2018/0082976 | A1 | 3/2018 | Edelstein et al. |  |
| 2024/0079401 | A1 * | 3/2024 | Or-Bach | H01L 21/28194 |

FOREIGN PATENT DOCUMENTS

| CN | 207367956 | U | 5/2018 |
|---|---|---|---|
| CN | 112820704 | A | 5/2021 |
| KR | 20020012061 | A | 2/2002 |
| KR | 20120126370 | A | 11/2012 |

* cited by examiner

PACKAGE STRUCTURE AND PACKAGING METHOD

CROSS-REFERENCE TO RELATED APPLICATIONS

This is a continuation of International Patent Application No. PCT/CN2022/071095 filed on Jan. 10, 2022, which claims priority to Chinese Patent Application No. 202111165993.4 filed on Sep. 30, 2021. The disclosures of the above-referenced applications are hereby incorporated by reference in their entirety.

BACKGROUND

Integrated Circuit (IC) packaging is an important production link in the technical field of integrated circuits. In recent years, the development of computer and communication related technologies has put forward higher requirements for integrated circuit packaging technologies, that is, smaller, thinner, lighter, more reliable, multifunctional, low power consumption, and low cost. When the Two-Dimensional assembly density has reached a theoretical maximum value, a higher-density Three-Dimensional stacking packaging technology (3D packaging) has begun to develop.

The 3D packaging is an advanced multi-chip module technology developed on the basis of a 2D stereoscopic Multi-Chip Module (2D-MCM) technology, and is a technology for performing 3D integration on an IC chip in the form of a 3D (x, y, and z directions) structure. The conventional 3D packaging refers to a packaging technology that more than two chips are stacked onto one another in a direction perpendicular to these chips in the same package without changing the dimension of the package.

SUMMARY

The disclosure relates, but is not limited, to a package structure and a packaging method.

The embodiments of the disclosure provide a package structure, which includes: at least two semiconductor structures that are stacked onto one another. Each of the at least two semiconductor structures includes a first surface and a second surface that are opposite to each other. Each of the at least two semiconductor structures includes a circuit area and a support area. At least one conductive structure is disposed in the circuit area in each of the at least two semiconductor structures further includes: at least one first metal layer and a second metal layer, the at least one first metal layer being located on the first surface in the circuit area, and the second metal layer being located on the first surface in the support area; and at least one third metal layer and a fourth metal layer, the at least one third metal layer being located on the second surface in the circuit area and being electrically connected to the at least one conductive structure, and the fourth metal layer being located on the second surface in the support area. The first surface of one semiconductor structure of the at least two semiconductor structures that are stacked onto one another directly faces toward the second surface of another semiconductor structure of the at least two semiconductor structures which is adjacent to said one semiconductor structure; the at least one first metal layer of said one semiconductor structure is in contact with and bonded to the at least one third metal layer of said another semiconductor structure adjacent to said one semiconductor structure; and the second metal layer of said one semiconductor structure is in contact with and bonded to the fourth metal layer of said another semiconductor structure adjacent to said one semiconductor structure.

The embodiments of the disclosure further provide a packaging method, including: at least two semiconductor structures are provided. Each of the at least two semiconductor structures includes a first surface and a second surface that are opposite to each other, each of the at least two semiconductor structures includes a circuit area and a support area, and at least one conductive structure is disposed in the circuit area in each of the at least two semiconductor structures. Each of the at least two semiconductor structures further includes: at least one first metal layer and a second metal layer, the at least one first metal layer being located on the first surface in the circuit area, and the second metal layer being located on the first surface in the support area; at least one third metal layer and a fourth metal layer, the at least one third metal layer being located on the second surface in the circuit area and being electrically connected to the at least one conductive structure, and the fourth metal layer being located on the second surface in the support area. Bonding treatment is performed on the at least two semiconductor structures, so that the first surface of one semiconductor structure of the at least two semiconductor structures directly faces toward the second surface of another semiconductor structure of the at least two semiconductor structures which is adjacent to said one semiconductor structure; the at least one first metal layer of said one semiconductor structure is in contact with and bonded to the at least one third metal layer of said another semiconductor structure adjacent to said one semiconductor structure; and the second metal layer of said one semiconductor structure is in contact with and bonded to the fourth metal layer of said another semiconductor structure adjacent to said one semiconductor structure.

BRIEF DESCRIPTION OF THE DRAWINGS

One or more embodiments are illustrated by the pictures in the corresponding accompanying drawings, and these exemplary descriptions do not constitute a limitation to the embodiments. Unless otherwise stated, the figures in the accompanying drawings do not constitute a proportional limitation.

REFERENCE NUMERALS IN THE DRAWINGS

101, 201—circuit area; 102, 202—support area; 103, 203—first surface; 111, 211—first metal layer; 112, 212—second metal layer;
204—second surface; 205—circuit structure; 206—isolation structure; 207—substrate; 208—conductive structure; 209—first carrier; 210—first metal film; 219—second carrier; 220—insulating layer; 221—first dielectric layer; 222—second dielectric layer; 223—initial first dielectric layer; 224—initial second dielectric layer; 230—second metal film; 231—third metal layer; and 232—fourth metal layer.

DETAILED DESCRIPTION

At present, the existing integrated circuits have thermal problems.

Figure 1:
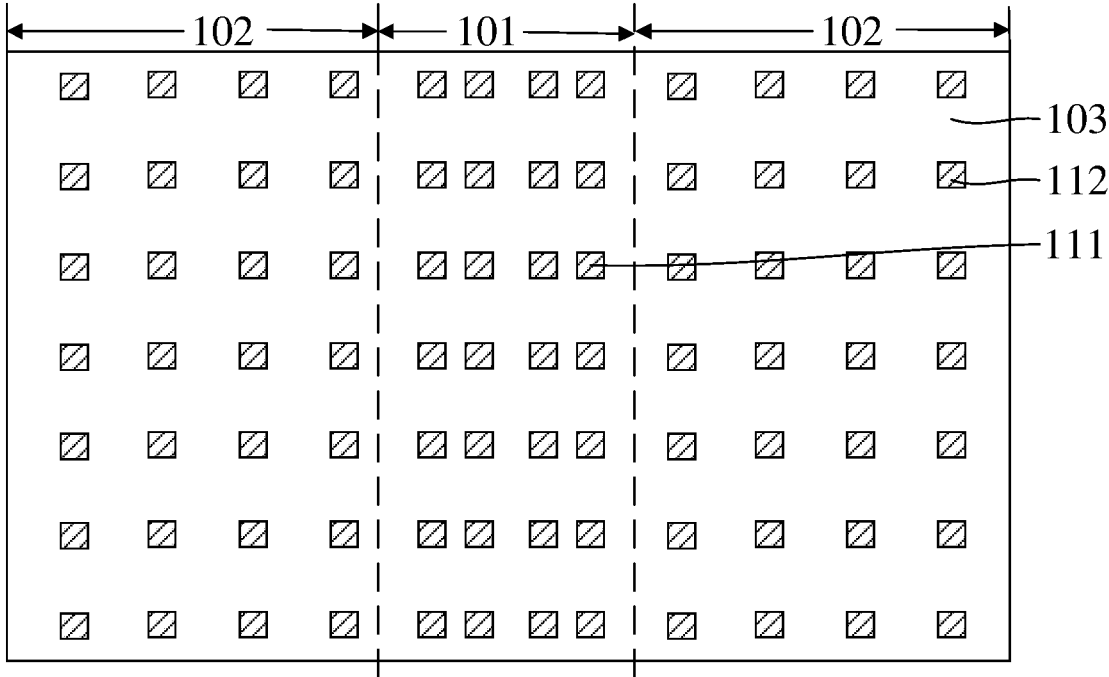
FIG. 1 illustrates a schematic diagram of a package structure.

Through analysis, it is found that the main reasons of the above problems include: in 3D packaging, the number of various micro components (bare chips and chip type components) stacked onto one another increases, thus there are thermal problems in the integrated circuits. In addition, micro components forming the integrated circuits are assembled together by mostly using micro welding and packaging processes in current 3D packaging. FIG. 1 illustrates a schematic diagram of a package structure. In combination with FIG. 1, the package structure includes at least two semiconductor structures that are stacked onto one another. Each of the semiconductor structures includes a first surface 103 and a second surface that are opposite to each other. Each of the semiconductor structures includes a circuit area 101 and a support area 102. Each of the semiconductor structures further includes: a first metal layer 111 and a second metal layer 112, the first metal layer 111 being located on the first surface 103 in the circuit area 101, and the second metal layer 112 being located on the first surface 103 in the support area 102; and a third metal layer and a fourth metal layer, the third metal layer being located on the second surface of the circuit area 101, and the fourth metal layer being located on the second surface of the support area 102. In a 3D packaging technology, a metal wire is used for welding. The welded metal wire is located between the micro components stacked onto one another. That is, the welded metal wire is located between the first metal layer 111 and the third metal layer of the semiconductor structure in an adjacent layer, and is located between the second metal layer 112 and the fourth metal layer of the semiconductor structure in an adjacent layer. In one aspect, the welded metal wire is located between the micro components stacked onto one another, which increases the dimension of an integrated circuit in the vertical direction and further increases the power consumption of the integrated circuit. In the other aspect, the welded metal wire is located between the micro components stacked onto one another, which increases the distance between the micro components stacked onto one another, resulting in signal transmission delay and loss. In addition, the thermal conductivity of the welded metal wire is lower than the thermal conductivity of the first metal layer 111, the thermal conductivity of the second metal layer 112, the thermal conductivity of the third metal layer, and the thermal conductivity of the fourth metal layer. The welded metal wire is located between the micro components stacked onto one another, which leads to more serious thermal problems of the integrated circuit and leads to the failure to conduct the heat out in time, thereby further affecting the performance of a device.

The embodiments of the disclosure provide a package structure with excellent structural performance. The package structure includes at least two semiconductor structures that are stacked onto one another. A first metal layer of one of the semiconductor structures is in contact with and bonded to the third metal layer of another one of the semiconductor structures adjacent to said one of the semiconductor structures, and the second metal layer of one of the semiconductor structures is in contact with and bonded to the fourth metal layer of another one of the semiconductor structures adjacent to said one of the semiconductor structures. The first metal layer is directly in contact with and bonded to the third metal layer and the second metal layer is directly in contact with and bonded to the fourth metal layer, which are equivalent to effectively shortening the distance between at least two semiconductor structures that are stacked onto one another, reducing the signal transmission delay and loss, improving signal speed and transmission bandwidth, and reducing power consumption, package volume and package weight. In addition, the first metal layer is directly in contact with and bonded to the third metal layer and the second metal layer is directly in contact with and bonded to the fourth metal layer, which can increase the area of the first metal layer, the area of the second metal layer, the area of the third metal layer, and the area of the fourth metal layer, and can solve the thermal problem of the integrated circuit.

Various embodiments of the disclosure will be illustrated in detail below with reference to the accompanying drawings. However, those of ordinary skill in the art can understand that in various embodiments of the disclosure, many technical details have been proposed in order to make a reader better understand the disclosure. However, the technical solutions claimed in the disclosure can also be realized even without these technical details and various changes and modifications based on the following embodiments.

Figure 2:
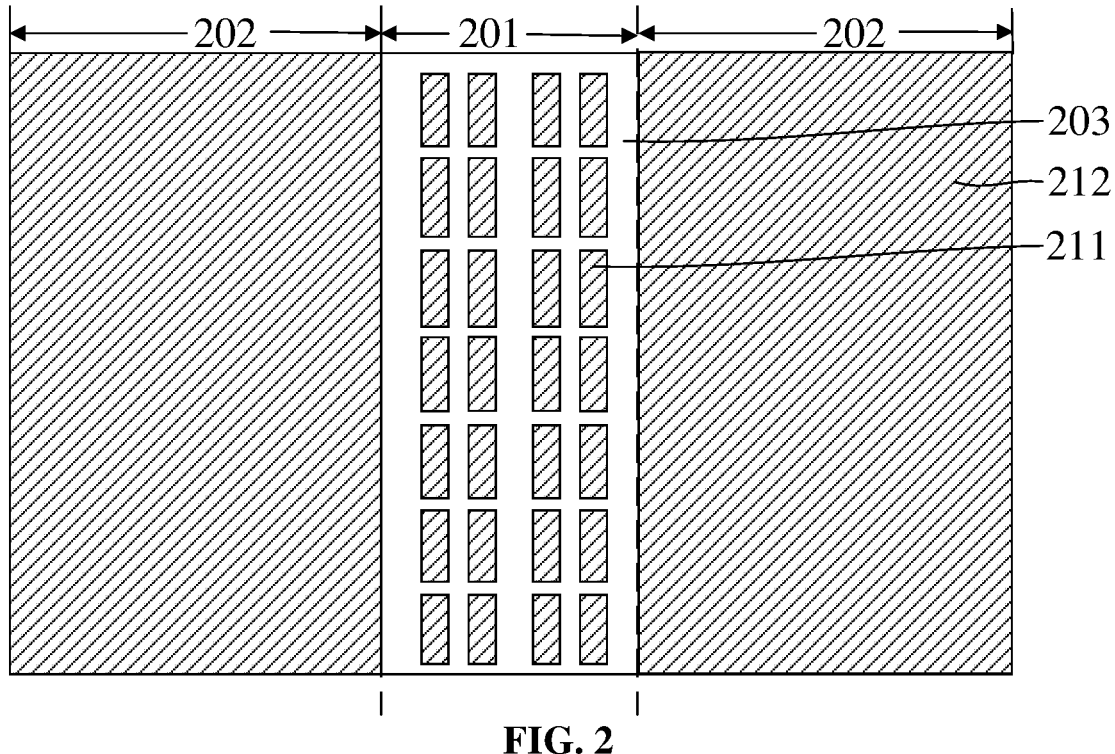
FIG. 2 illustrates a schematic diagram of a package structure provided by an embodiment of the disclosure.
Figure 3:
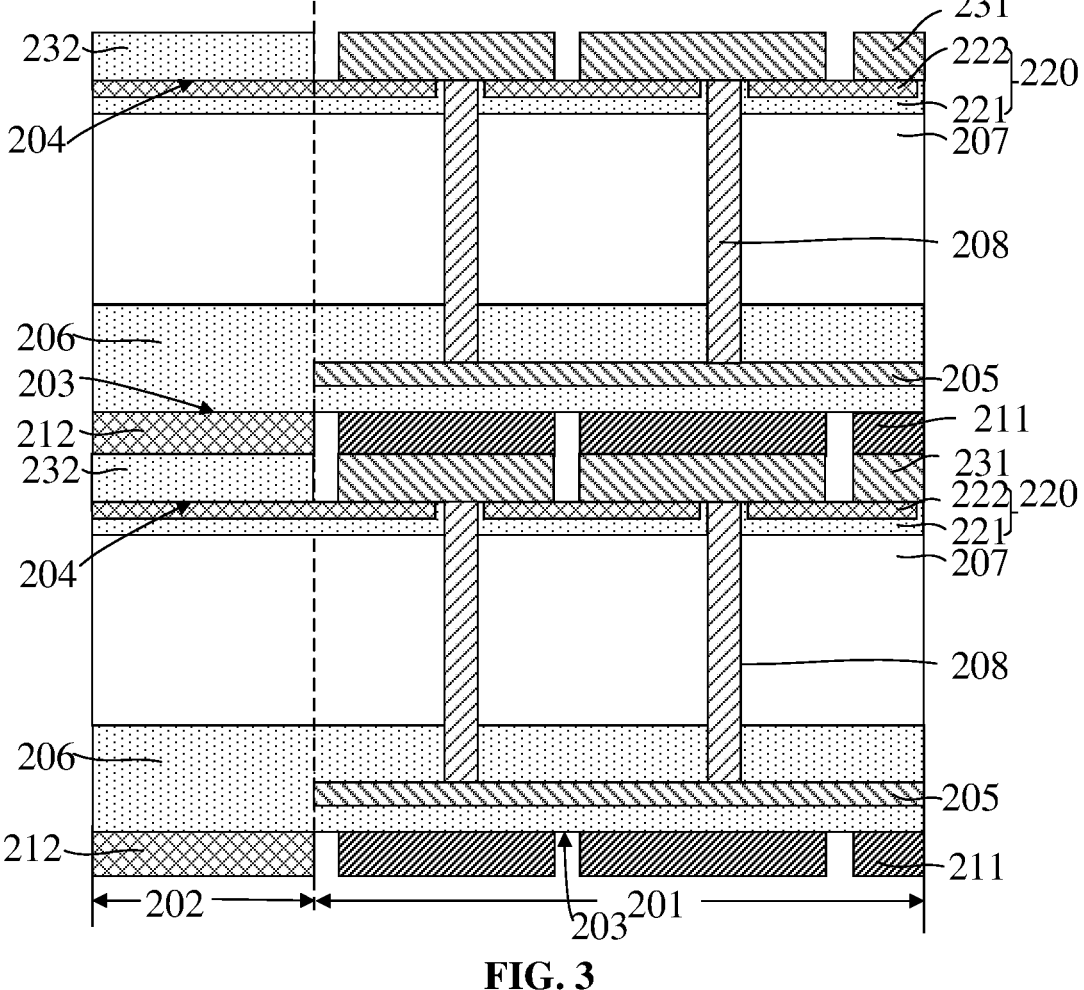
FIG. 3 illustrates a sectional view of a package structure taken along an A-A section provided by an embodiment of the disclosure.

FIG. 2 illustrates a schematic diagram of a package structure provided by an embodiment of the disclosure. FIG. 3 illustrates a sectional view of a package structure taken along an A-A section provided by an embodiment of the disclosure.

With reference to FIG. 2 and FIG. 3, the package structure includes at least two semiconductor structures that are stacked onto one another. Each of the at least two semiconductor structures includes a first surface 203 and a second surface 204 that are opposite to each other. Each of the at least two semiconductor structures includes a circuit area 201 and a support area 202. A conductive structure 208 is disposed in the circuit area 201 in each of the at least two semiconductor structures. Each of the at least two semiconductor structures further includes: a first metal layer 211 and a second metal layer 212, the first metal layer 211 being located on the first surface 203 in the circuit area 201, and the second metal layer 212 being located on the first surface 203 in the support area 202; and a third metal layer 231 and a fourth metal layer 232, the third metal layer 231 being located on the second surface 204 in the circuit area 201 and being electrically connected to the conductive structure 208, and the fourth metal layer 232 being located on the second surface 204 in the support area 202. The first surface 203 of one semiconductor structure of the at least two semiconductor structures that are stacked onto one another directly faces toward the second surface 204 of another semiconductor structure of the at least two semiconductor structures which is adjacent to said one semiconductor structure. The first metal layer 211 of said one semiconductor structure is in contact with and bonded to the third metal layer 231 of said another semiconductor structure adjacent to said one semiconductor structure; and the second metal layer 212 of said one semiconductor structure is in contact with and bonded to the fourth metal layer 232 of said another semiconductor structure adjacent to said one semiconductor structure.

The package structure includes at least two semiconductor structures that are stacked onto one another. The first metal layer 211 of one semiconductor structure of the at least two semiconductor structures is in contact with and bonded to the third metal layer 231 of another semiconductor structure of the at least two semiconductor structures which is adjacent to said one semiconductor structure, and the second metal layer 212 of said one semiconductor structure is in contact with and bonded to the fourth metal layer 232 of said another semiconductor structure adjacent to said one semiconductor structure. That is, high-density vertical interconnection of the at least two semiconductor structures is realized through bonded contact of the first metal layer 211 and the third metal layer 231 and bonded contact of the second metal layer 212 and the fourth metal layer 232. The first metal layer 211 is directly in contact with and bonded to the third metal layer 231 and the second metal layer 212 is directly in contact with and bonded to the fourth metal layer 232, which are equivalent to that there is no welding metal wire between at least two semiconductor structures that are stacked onto one another. In one aspect, the distance between the at least two semiconductor structures that are stacked onto one another is effectively shortened, the signal transmission delay and loss are reduced, the signal speed and transmission bandwidth are improved, the power consumption, the package volume, and the package weight are reduced. In the other aspect, the thermal problem of the integrated circuit is improved. In addition, there is no welding metal wire between at least two semiconductor structures that are stacked onto one another, which can increase the area of the first metal layer 211, the area of the second metal layer 212, the area of the third metal layer 231, and the area of the fourth metal layer 232, so as to increase the content proportions of the first metal layer 211, the second metal layer 212, the third metal layer 231, and the fourth metal layer 232 to the semiconductor structure, which further facilitates improving the thermal problem of the integrated circuit.

In some embodiments, each of the at least two semiconductor structures further includes a circuit structure 205, an isolation structure 206, and a substrate 207. The circuit structure 205 is located in the circuit area 201 in each of the at least two semiconductor structures and is electrically connected to the conductive structure 208. The isolation structure 206 and the substrate 207 are located in the circuit area 201 and the support area 202 in each of the at least two semiconductor structures.

Each semiconductor structure is one of various micro components forming the integrated circuit. In some embodiments, each semiconductor structure is a wafer. In some other embodiments, each semiconductor structure may be a chip.

In some embodiments, the first surface 203 of each semiconductor structure is a top surface of said semiconductor structure, and the second surface 204 of each semiconductor structure is a bottom surface of said semiconductor structure.

In some embodiments, a circuit structure is disposed in the circuit area 201. The circuit structure is electrically connected to the third metal layer 231 through the conductive structure 208. The first metal layer 211 of one semiconductor structure is in contact with and bonded to the third metal layer 231 of another semiconductor structure located in an adjacent layer, so as to ensure that the at least two semiconductor structures that are stacked onto one another are vertically interconnected with each other and establish signal transmission. There is no circuit structure in the support area 202, and the support area 202 achieves a supporting effect between the at least two semiconductor structures that are stacked onto one another.

In some embodiments, each semiconductor structure includes a plurality of first metal layers 211 that are spaced apart from each other. In the arrangement direction of the support area 202 and the circuit area 201, the ratio of the spacing between any adjacent first metal layers 211 of the plurality of first metal layers 211 to the width of each of the plurality of first metal layers 211 ranges from $\frac{1}{12}$ to $\frac{3}{4}$, specifically $\frac{1}{6}$, $\frac{1}{2}$, or $\frac{3}{5}$. In one aspect, the discontinuity between the adjacent first metal layers 211 can be ensured, so that a plurality of conductive structures 208 in the circuit area 201 are not electrically connected with each other during bonded contact of the first metal layer 211 and the third metal layer 231 of the another semiconductor structure located in the adjacent layer, thereby avoiding a short-circuit condition of the semiconductor structure. In the other aspect, the area of the first metal layer 211 is as large as possible, which is equivalent to that the content of the first metal layer 211 of the semiconductor structure is as high as possible, which facilitates promoting the heat dissipation of the integrated circuit and further improving the stability of the integrated circuit.

Specifically, in the arrangement direction of the support area 202 and the circuit area 201, the width of each of the plurality of first metal layers 211 ranges from 40 μm to 60 μm, specifically, 45 μm, 50 μm, or 55 μm. The spacing between any adjacent first metal layers 211 of the plurality of first metal layers 211 ranges from 5 μm to 30 μm, specifically 10 μm, 15 μm, 20 μm, or 25 μm.

In some embodiments, in a direction from the first surface 203 to the second surface 204, the thickness of each of the plurality of first metal layers 211 ranges from 1 μm to 100 μm, specifically 10 μm, 30 μm, 50 μm, 70 μm, or 90 μm. In one aspect, the content proportion of the first metal layer 211 to the semiconductor structure is ensured to be as high as possible, which facilitates promoting the heat dissipation of the integrated circuit and further improving the stability of the integrated circuit. In the other aspect, memory capacity of a single integrated circuit is as large as possible, that is, as many as semiconductor structures are stacked onto one another in a limited space of the single integrated circuit.

In some embodiments, an orthographic projection of each of the plurality of first metal layers 211 on the first surface 203 is a rectangle. The length of the rectangle ranges from 55 μm to 200 μm, specifically 60 μm, 80 μm, 100 μm, or 150 μm; and the width of the rectangle ranges from 40 μm to 60 μm, specifically 45 μm, 50 μm, or 55 μm.

In some embodiments, the material of the first metal layer 211 is copper. The thermal conductivity coefficient of the copper is 401 W/(m·K). In some other embodiments, the material of the first metal layer may also be zinc, silver, aluminum, or tungsten. The thermal conductivity coefficient of the zinc is 112 W/(m·K), the thermal conductivity coefficient of the silver is 429 W/(m·K), the thermal conductivity coefficient of the aluminum is 237 W/(m·K), and the thermal conductivity coefficient of the tungsten is 173 W/(m·K).

In some embodiments, the second metal layer 212 located in the support area 202 is an entire continuous film layer. In one aspect, this ensures that a supporting effect is achieved between the two semiconductor structures that are stacked onto one another; and in the other aspect, the content proportion of the second metal layer 212 to the semiconductor structure is relatively large, which facilitates promoting the heat dissipation of the integrated circuit and further improving the stability of the integrated circuit.

In some embodiments, in the direction from the first surface 203 to the second surface 204, the thickness of the second metal layer 212 may be the same as the thickness of the first metal layer 211. In some other embodiments, the thickness of the second metal layer may be different from the thickness of the first metal layer.

In some embodiments, the material of the second metal layer 212 may be the same as the material of the first metal layer 211. In some other embodiments, the material of the second metal layer may be different from the material of the first metal layer.

In some embodiments, an orthographic projection of each of a plurality of third metal layers 231 on the first surface 203 is located within an orthographic projection of a respective one of the plurality of first metal layers 211 that is in contact with and bonded to each of the plurality of third metal layers 231 on the first surface 203. The size of the orthographic projection of each of a plurality of third metal layers 231 on the first surface 203 is the same as the size of the orthographic projection of a respective one of the plurality of first metal layers 211 that is in contact with and bonded to each of the plurality of third metal layers 231 on the first surface 203. That is, each of the plurality of first metal layers 211 directly faces toward a respective one of the plurality of third metal layers 231, which ensures that each of the area of the first metal layer 211 and the area of the third metal layer 231 is maximized, and facilitates improving the thermal problem of the integrated circuit.

In some other embodiments, the orthographic projection of each third metal layer on the first surface is located within the orthographic projection of the respective first metal layer that is in contact with and bonded to each third metal layer on the first surface, and the orthographic projection of each third metal layer on the first surface is less than the orthographic projection of the respective first metal layer that is in contact with and bonded to each third metal layer on the first surface.

In some embodiments, in the direction from the first surface 203 to the second surface 204, the thickness of the third metal layer 231 may be the same as the thickness of the first metal layer 211. In some other embodiments, the thickness of the third metal layer may be different from the thickness of the first metal layer.

In some embodiments, the material of the third metal layer 232 may be the same as the material of the first metal layer 211. In some other embodiments, the material of the third metal layer may be different from the material of the first metal layer.

In some embodiments, the fourth metal layer 232 located in the support area 202 is an entire continuous film layer. In one aspect, this ensures that a supporting effect is achieved between the two semiconductor structures that are stacked onto one another; and in the other aspect, the content proportion of the fourth metal layer 212 to the semiconductor structure is relatively large, which facilitates promoting the heat dissipation of the integrated circuit and further improving the stability of the integrated circuit.

In some embodiments, the orthographic projection of the fourth metal layer 232 on the first surface 203 is located within the orthographic projection of the second metal layer 212 that is in contact with and bonded to the fourth metal layer 232 on the first surface 203, and the size of the orthographic projection of the fourth metal layer 232 on the first surface 203 is the same as the size of the orthographic projection of the second metal layer 212 that is in contact with and bonded to the fourth metal layer 232 on the first surface 232. That is, each second metal layer 212 directly faces toward each fourth metal layer 232, which ensures each of the area of the second metal layer 212 and the area of the fourth metal layer 232 is maximized, and facilitates improving the thermal problem of the integrated circuit.

In some other embodiments, the orthographic projection of the fourth metal layer on the first surface is located within the orthographic projection of the second metal layer that is in contact with and bonded to the fourth metal layer on the first surface, and the orthographic projection of the fourth metal layer on the first surface is less than the orthographic projection of the second metal layer that is in contact with and bonded to the fourth metal layer on the first surface.

In the direction from the first surface 203 to the second surface 204, an upper surface of the fourth metal layer 232 is flush with an upper surface of each of the plurality of third metal layers 231. Specifically, in some embodiments, in the direction from the first surface 203 to the second surface 204, the thickness of the fourth metal layer 232 is less than the thickness of each of the plurality of third metal layers 231. In some other embodiments, in the direction from the first surface to the second surface, the thickness of the fourth metal layer is equal to or greater than the thickness of each of the plurality of third metal layers.

In some other embodiments, the material of the fourth metal layer 232 may be the same as the material of the second metal layer 231. In some other embodiments, the material of the fourth metal layer may be different from the material of the second metal layer.

In some other embodiments, each of the plurality of conductive structures 208 protrudes from the second surface 204 in the circuit area 201, which ensures the electrical connection between the plurality of conductive structures 208 and the plurality of third metal layers 231.

In some embodiments, the material of the isolation structure 206 is silicon oxide; and the material of the substrate 207 is silicon. In some other embodiments, the material of the isolation structure may be silicon carbide or silicon nitride; and the material of the substrate may also be germanium, silicon germanium, or silicon carbide.

In some embodiments, each semiconductor structure further includes an insulating layer 220. The insulating layer 220 is located on the second surface 204 in the circuit area 201. The insulating layer 220 is further located on side surfaces of the plurality of protruded conductive structures 208. The plurality of third metal layers 231 are located on a surface of the insulating layer 220.

In some other embodiments, the insulating layer 220 further includes: a first dielectric layer 221, the first dielectric layer 221 being located on the second surface 204 in the circuit area 201, and the first dielectric layer 221 being further located on the side surfaces of the plurality of protruded conductive structures 208; and a second dielectric layer 222, the second dielectric layer 222 being located between the first dielectric layer 221 and the plurality of third metal layers 231.

In some embodiments, the material of the first dielectric layer 221 is an insulating material, specifically silicon oxide; and the material of the second dielectric layer 222 is silicon nitride. In some other embodiments, the material of the first dielectric layer may be silicon carbide or silicon nitride; and the material of the second dielectric layer may be insulating materials such as silicon oxide and silicon carbide, or other high-dielectric constant materials.

In some embodiments of the disclosure, the package structure includes at least two semiconductor structures that are stacked onto one another. A first metal layer of one semiconductor structure of the at least two semiconductor structures is in contact with and bonded to the third metal layer of another semiconductor structure of the at least two semiconductor structures which is adjacent to said one semiconductor structure, and the second metal layer of said one semiconductor structure is in contact with and bonded to the fourth metal layer of said another semiconductor structure adjacent to said one semiconductor structure. The first metal layer is directly in contact with and bonded to the third metal layer and the second metal layer is directly in contact with and bonded to the fourth metal layer, which effectively shortens the distance between at least two semiconductor structures that are stacked onto one another, reduces the signal transmission delay and loss, improves signal speed and transmission bandwidth, and reduces power consumption, package volume and package weight. In addition, the first metal layer is directly in contact with and bonded to the third metal layer and the second metal layer is directly in contact with and bonded to the fourth metal layer, which can increase the area of the first metal layer, the area of the second metal layer, the area of the third metal layer, and the area of the fourth metal layer, and can improve the thermal problem of the integrated circuit. Moreover, the material of the first metal layer, the material of the second metal layer, the material of the third metal layer, and the material of the fourth metal layer are all copper, and direct contact between copper and copper can improve the heat dissipation performance of the semiconductor structure, which further improves the thermal problem of the integrated circuit.

Correspondingly, some embodiments of the disclosure provide a packaging method, which can be used for forming the abovementioned package structure.

FIG. 4 to FIG. 13 illustrate schematic diagrams corresponding to various operations in a packaging method provided by an embodiment of the disclosure. The packaging method provided by the embodiment will be described in detail with reference to accompanying drawings.

With reference to FIG. 4 to FIG. 12, at least two semiconductor structures are provided. Each of the at least two semiconductor structures includes a first surface 203 and a second surface 204 that are opposite to each other. Each of the at least two semiconductor structures includes a circuit area 201 and a support area 202. A conductive structure 208 is disposed in the circuit area 201 in each of the at least two semiconductor structures. Each of the at least two semiconductor structures further includes: a first metal layer 211 and a second metal layer 212, the first metal layer 211 being located on the first surface 203 in the circuit area 201, and the second metal layer 212 being located on the first surface 203 in the support area 202; and a third metal layer 231 and a fourth metal layer 232, the third metal layer 231 being located on the second surface 204 of the circuit area 201 and being electrically connected to the conductive structure 208, and the fourth metal layer 232 being located on the second surface 204 of the support area 202.

Figure 4:
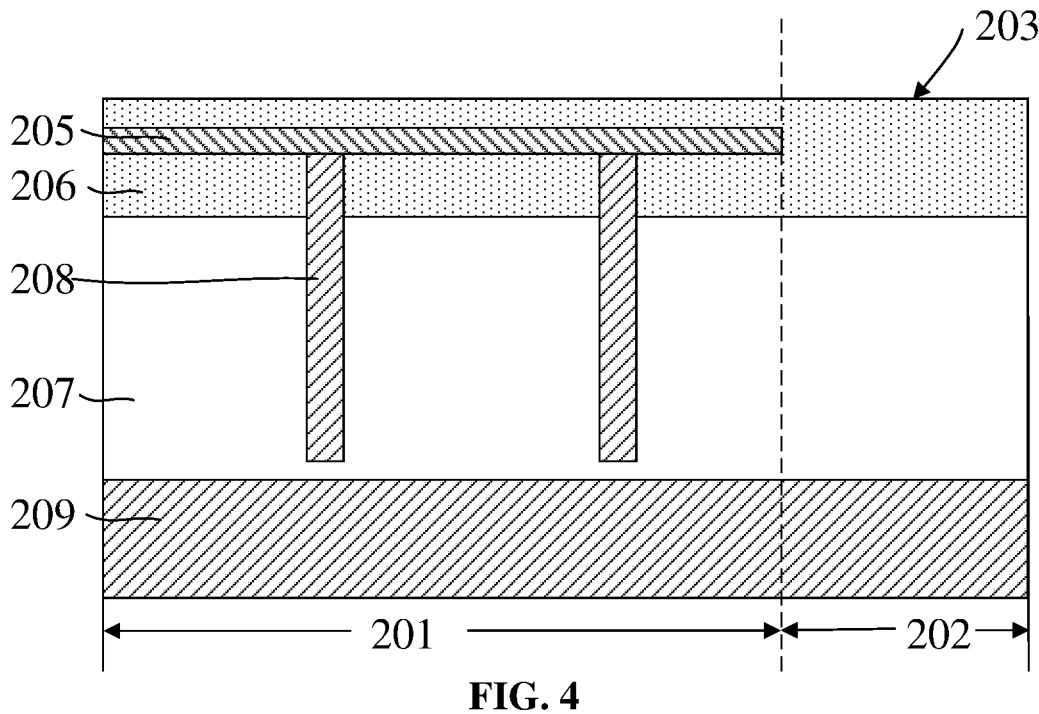
FIG. 4 illustrates a first sectional view corresponding to various operations in a packaging method provided by an embodiment of the disclosure.

With reference to FIG. 4, an initial semiconductor structure is provided. The initial semiconductor structure includes a first surface 203 and a second surface 204 that are opposite to each other. The initial semiconductor structure includes a circuit area 201 and a support area 202. An isolation structure 206 and a substrate 207 that are stacked onto one another are disposed in the circuit area 201 and the support area 202 in the initial semiconductor structure. A conductive structure 208 and a circuit structure 205 are disposed in the circuit area 201 in the initial semiconductor structure. The circuit structure 205 is also located in the isolation structure 206 and is electrically connected to the conductive structure 208. The isolation structure 206 and the substrate 207 are also located on a side surface of the conductive structure 208.

The initial semiconductor structure is one of various micro components forming the integrated circuit. In some embodiments, the initial semiconductor structure is a wafer. In some other embodiments, the initial the semiconductor structure may be a chip.

In some embodiments, the first surface 203 of the initial semiconductor structure is a top surface of the initial semiconductor structure, and the second surface 204 of the initial semiconductor structure is a bottom surface of the initial semiconductor structure. The initial semiconductor structure is located on a first carrier 209. The first surface 203 of the initial semiconductor structure faces away from a surface of the first carrier 209.

In some embodiments, a circuit structure is disposed in the circuit area 201. The circuit structure is electrically connected to the third metal layer 231 through the conductive structure 208. The first metal layer 211 of one semiconductor structure is in contact with and bonded to the third metal layer 231 of another semiconductor structure located in an adjacent layer, so as to ensure that at least two semiconductor structures that are stacked onto one another are vertically interconnected with each other and establish signal transmission. There is no circuit structure in the support area 202, and the support area 202 achieves a supporting effect between the at least two semiconductor structures that are stacked onto one another.

In some embodiments, the material of the isolation structure 206 is silicon oxide; and the material of the substrate 207 is silicon. In some other embodiments, the material of the isolation structure may be silicon carbide or silicon nitride; and the material of the substrate may also be germanium, silicon germanium, or silicon carbide.

Figure 5:
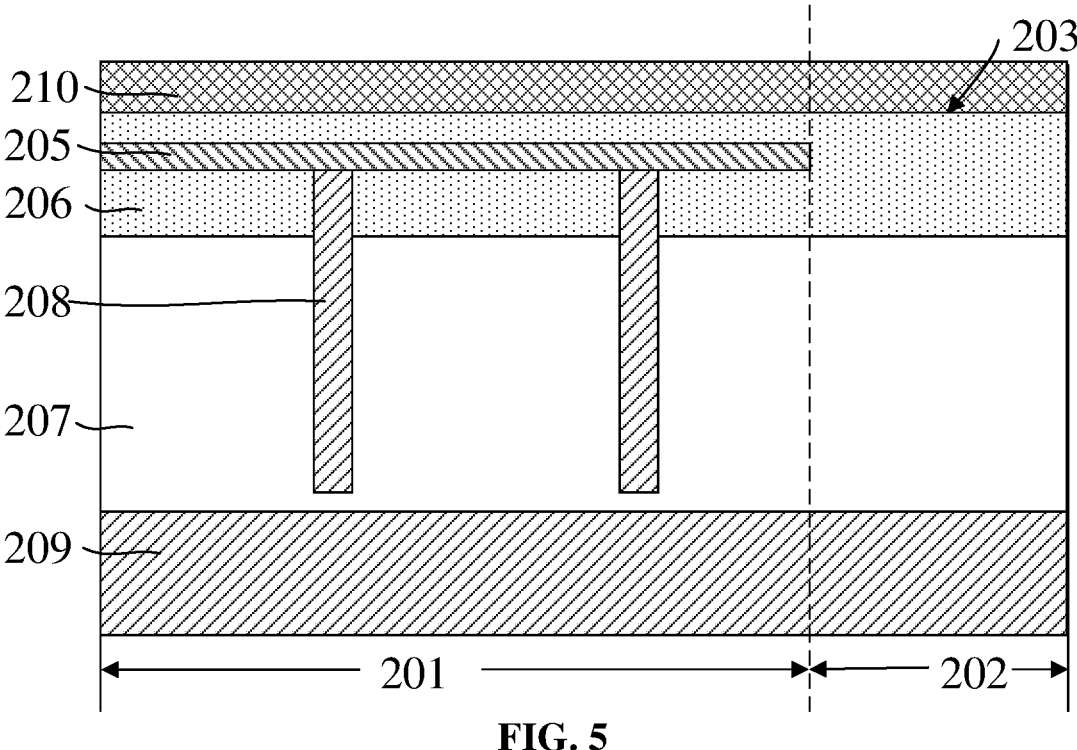
FIG. 5 illustrates a second sectional view corresponding to various operations in a packaging method provided by an embodiment of the disclosure.
Figure 6:
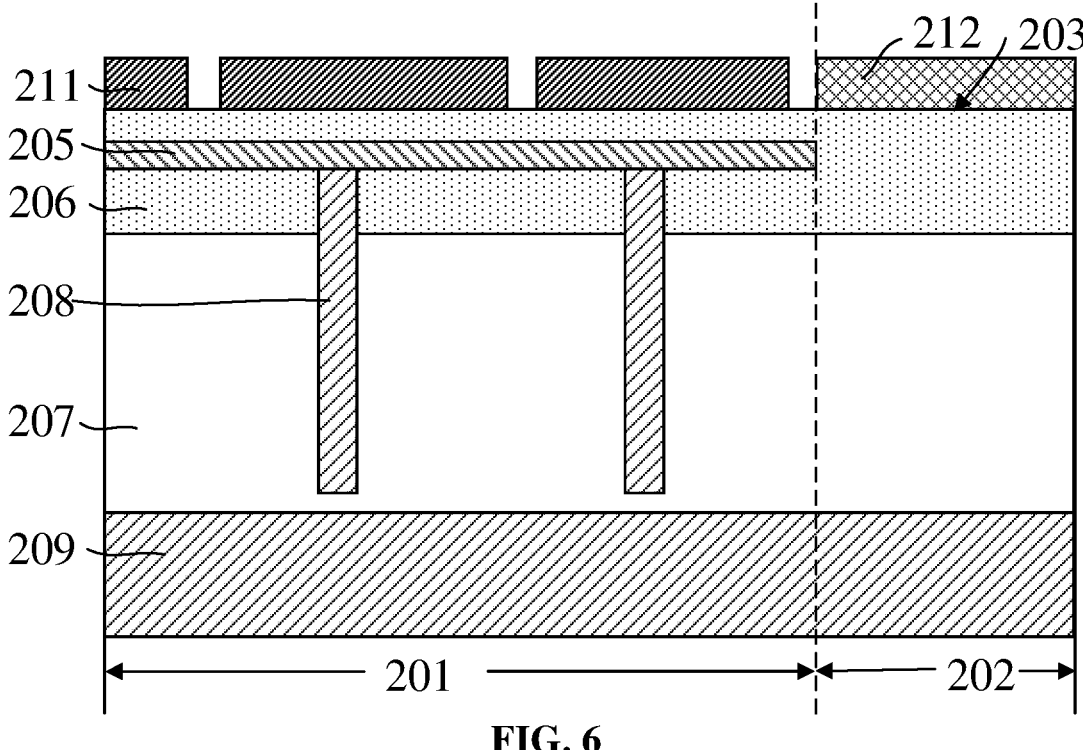
FIG. 6 illustrates a third sectional view corresponding to various operations in a packaging method provided by an embodiment of the disclosure.

With reference to FIG. 5 and FIG. 6, a first metal film 210 is formed on the first surface 203 of the initial semiconductor structure, and the first metal film 210 located in the circuit area 201 is patterned. Remaining portions of the first metal film 210 located in the circuit area 201 serve as a plurality of first metal layers 211, and the first metal film 210 located in the support area 202 serves as a second metal layer 212.

Specifically, with reference to FIG. 5, the first metal film 210 is formed on the first surface 203 of the initial semiconductor structure.

In some embodiments, in a direction from the first surface 203 to the second surface 204, the thickness of the first metal film 210 ranges from 1 μm to 100 μm, specifically 10 μm, 30 μm, 50 μm, 70 μm, or 90 μm. In one aspect, the content proportion of the first metal layer 211 to the semiconductor structure is ensured to be as high as possible, which facilitates promoting the heat dissipation of the integrated circuit and further improving the stability of the integrated circuit. In the other aspect, memory capacity of a single integrated circuit is as large as possible, that is, as many as semiconductor structures are stacked onto one another in a limited space of the single integrated circuit.

In some embodiments, the material of the first metal mask 210 is copper. The thermal conductivity coefficient of the copper is 401 W/(m·K). In some other embodiments, the material of the first metal film may also be zinc, silver, aluminum, or tungsten. The thermal conductivity coefficient of the zinc is 112 W/(m·K), the thermal conductivity coefficient of the silver is 429 W/(m·K), the thermal conductivity coefficient of the aluminum is 237 W/(m·K), and the thermal conductivity coefficient of the tungsten is 173 W/(m·K).

With reference to FIG. 6, a first mask layer is formed on the first metal film 210; and the first metal film 210 located in the circuit area 201 is etched by taking the first mask layer as a mask, to form a plurality of first metal layers 211 spaced apart from each other, where the first metal film 210 located in the support area 202 serves as a second metal layer 212. The first mask layer is removed.

In some embodiments, the semiconductor structure includes a plurality of first metal layers 211 that are spaced apart from each other. In the arrangement direction of the support area 202 and the circuit area 201, the ratio of the spacing between any adjacent first metal layers 211 of the plurality of first metal layers 211 to the width of each of the plurality of first metal layers 211 ranges from 1/12 to 3/4, specifically 1/6, 1/2, or 3/5. In one aspect, the discontinuity between the adjacent first metal layers 211 can be ensured, so that a plurality of conductive structures 208 in the circuit area 201 are not electrically connected with each other during bonded contact of the first metal layer 211 and the third metal layer 231 of the another semiconductor structure located in the adjacent layer, thereby avoiding a short-circuit condition of the semiconductor structure. In the other aspect, the area of the first metal layer 211 is as large as possible, which is equivalent to that the content of the first metal layer 211 of the semiconductor structure is as high as possible, which facilitates promoting the heat dissipation of the integrated circuit and further improving the stability of the integrated circuit.

Specifically, in the arrangement direction of the support area 202 and the circuit area 201, the width of each of the plurality of first metal layers 211 ranges from 40 μm to 60 μm, specifically, 45 μm, 50 μm, or 55 μm. The spacing between any adjacent first metal layers 211 of the plurality of first metal layers 211 ranges from 5 μm to 30 μm, specifically 10 μm, 15 μm, 20 μm, or 25 μm.

In some embodiments, an orthographic projection of each of the plurality of first metal layers 211 on the first surface 203 is a rectangle. The length of the rectangle ranges from 55 μm to 200 μm, specifically 60 μm, 80 μm, 100 μm, or 150 μm; and the width of the rectangle ranges from 40 μm to 60 μm, specifically 45 μm, 50 μm, or 55 μm.

In some embodiments, the second metal layer 212 located in the support area 202 is an entire continuous film layer. In one aspect, this ensures that a supporting effect is achieved between the two semiconductor structures that are stacked onto one another; and in the other aspect, the content proportion of the second metal layer 212 to the semiconductor structure is relatively large, which facilitates promoting the heat dissipation of the integrated circuit and further improving the stability of the integrated circuit.

Figure 7:
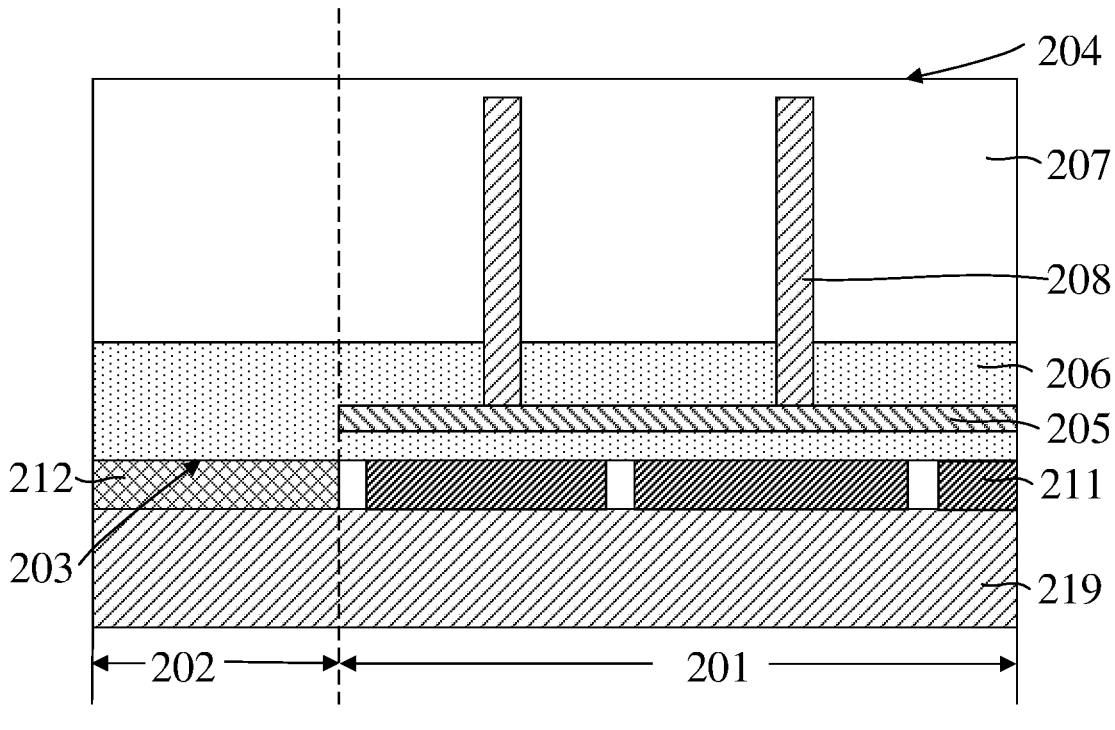
FIG. 7 illustrates a fourth sectional view corresponding to various operations in a packaging method provided by an embodiment of the disclosure.

With reference to FIG. 7, the first carrier 209 is removed, and bonding treatment is performed on a second carrier 219 and the initial semiconductor structure.

In some embodiments, the initial semiconductor structure is located on the first carrier 219. The second surface 204 of the initial semiconductor structure faces away from a surface of the second carrier 219.

Figure 8:
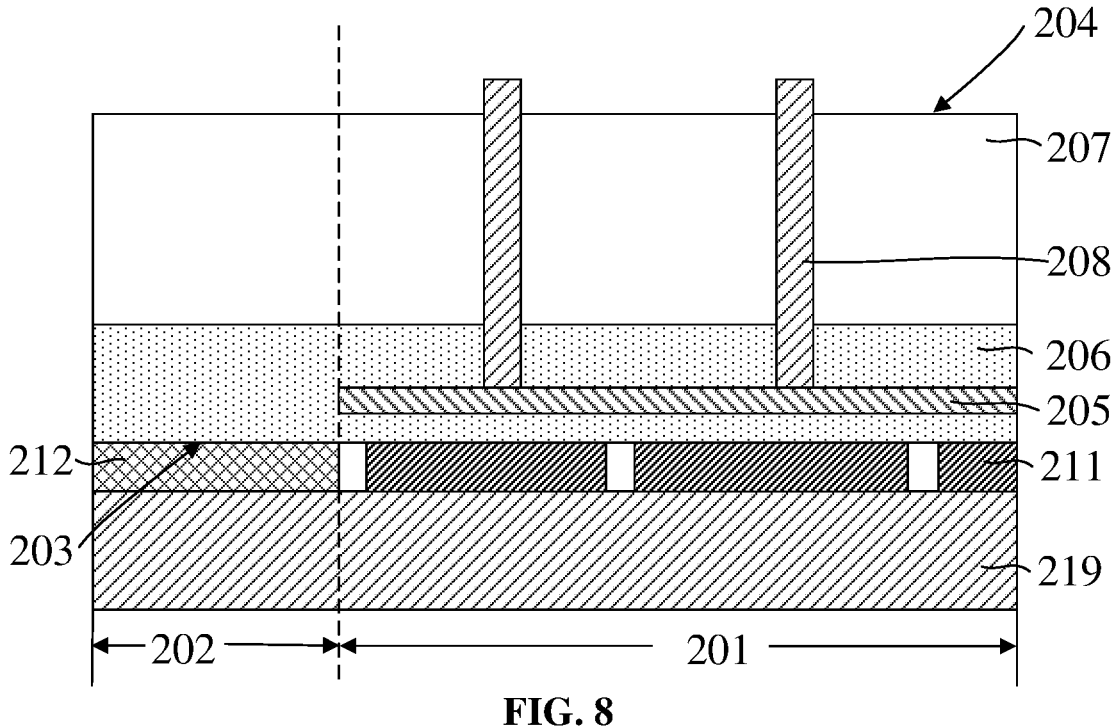
FIG. 8 illustrates a fifth sectional view corresponding to various operations in a packaging method provided by an embodiment of the disclosure.
Figure 9:
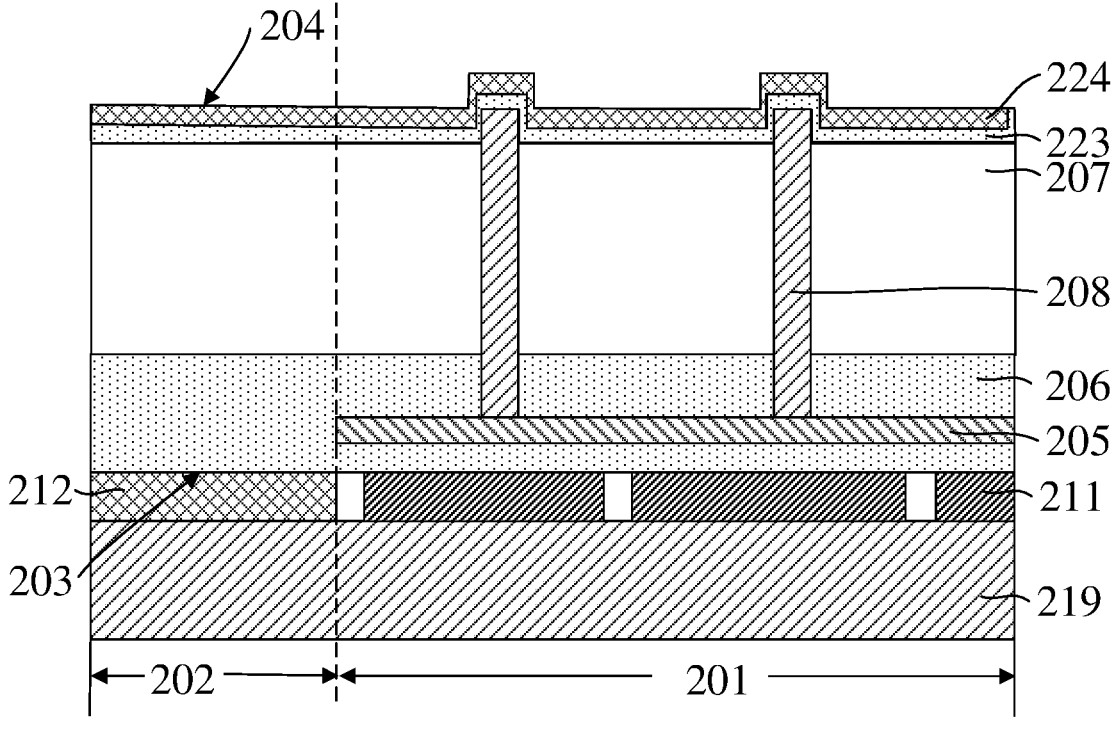
FIG. 9 illustrates a sixth sectional view corresponding to various operations in a packaging method provided by an embodiment of the disclosure.
Figure 10:
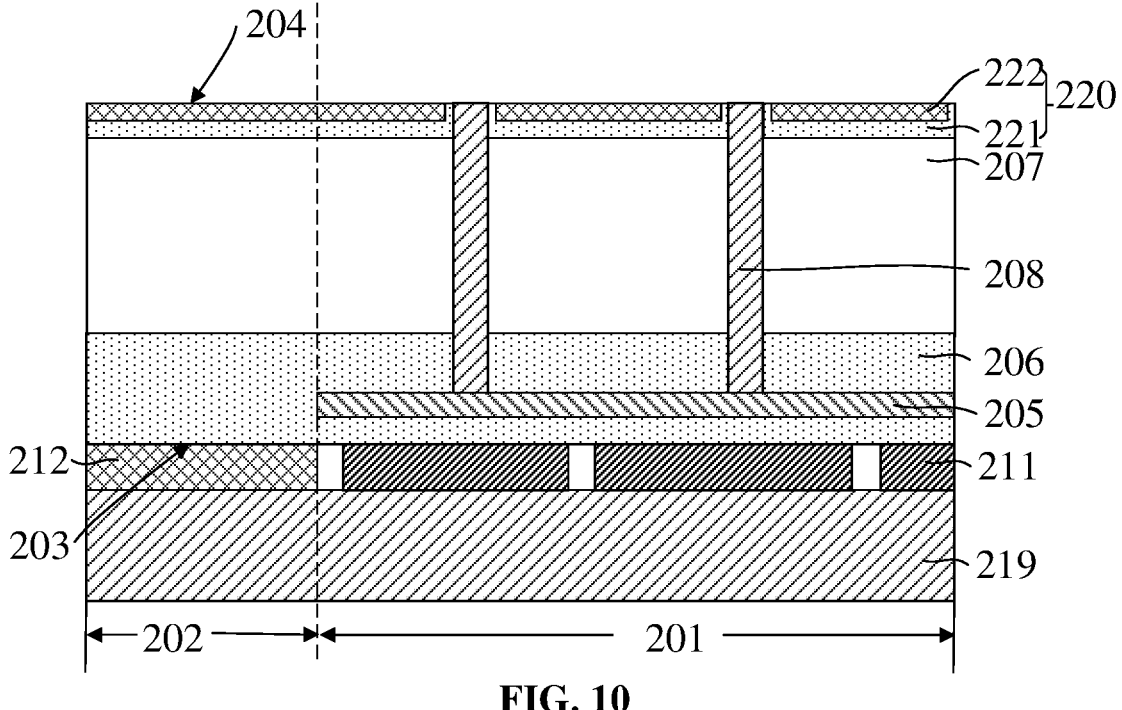
FIG. 10 illustrates a seventh sectional view corresponding to various operations in a packaging method provided by an embodiment of the disclosure.

With reference to FIG. 8 to FIG. 10, thinning treatment is performed on the second surface 204 of the initial semiconductor structure to expose a part of the thickness of each of the plurality of conductive structures 208. A first dielectric layer 221 and a second dielectric layer 222 are successively formed on the second surface 204 of the initial semiconductor structure. The first dielectric layer 221 is also located on the side surface of the part of the thickness of each of the plurality of conductive structures 208.

With reference to FIG. 8, thinning treatment is performed on the substrate 207 in the circuit area 201 and the support area 202 of the initial semiconductor structure simultaneously, so that an upper surface of the substrate 207 in the support area 202 is flush with an upper surface of the substrate 207 in the circuit area 201, and a part of the thickness of each of the plurality of conductive structures 208 is exposed, which increases the content proportion of the subsequently formed fourth metal layer to the semiconductor structure, and facilitates solving the thermal problem of the integrated circuit.

With reference to FIG. 9, an initial first dielectric layer 223 and an initial second dielectric layer 224 are successively formed on the substrate 207. The initial first dielectric layer 223 and the initial second dielectric layer 224 are also located on the plurality of conductive structures 208.

Specifically, in some embodiments, the material of the initial first dielectric layer 223 is an insulating material, specifically silicon oxide; and the material of the initial second dielectric layer 224 is silicon nitride. In some other embodiments, the material of the initial first dielectric layer may be silicon carbide or silicon nitride; and the material of the initial second dielectric layer may be insulating materials such as silicon oxide and silicon carbide, or other high-dielectric constant materials.

In some embodiments, in the direction from the first surface 203 to the second surface 204, the thickness of the initial first dielectric layer 223 located on the substrate 207 is the same as the thickness of the initial first dielectric layer 223 located on the plurality of conductive structures 208; and the thickness of the initial second dielectric layer 224 located on the substrate 207 is the same as the thickness of the initial second dielectric layer 224 located on the plurality of conductive structures 208.

In some other embodiments, the initial first dielectric layer and the initial second dielectric layer are successively formed on the substrate only in the circuit area, which increases the content proportion of the subsequently formed fourth metal layer to the semiconductor structure, and facilitates improving the thermal problem of the integrated circuit.

With reference to FIG. 10, the initial first dielectric layer 223 and the initial second dielectric layer 224 located on surfaces of the plurality of conductive structures 208 are etched to expose the plurality of conductive structures 208, so that the subsequently formed third metal layers are electrically connected to the plurality of conductive structures 208. The remaining portion of the initial first dielectric layer 223 serves as the first dielectric layer 221, and the remaining portion of the initial second dielectric layer 224 serves as the second dielectric layer 222.

Figure 11:
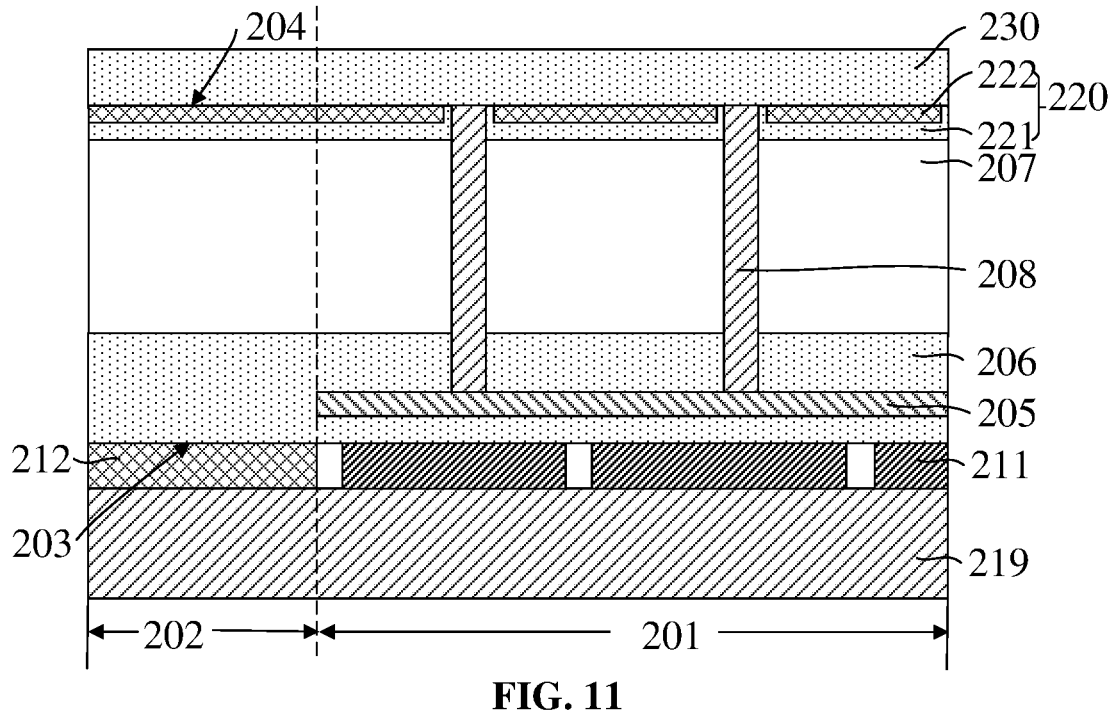
FIG. 11 illustrates an eighth sectional view corresponding to various operations in a packaging method provided by an embodiment of the disclosure.
Figure 12:
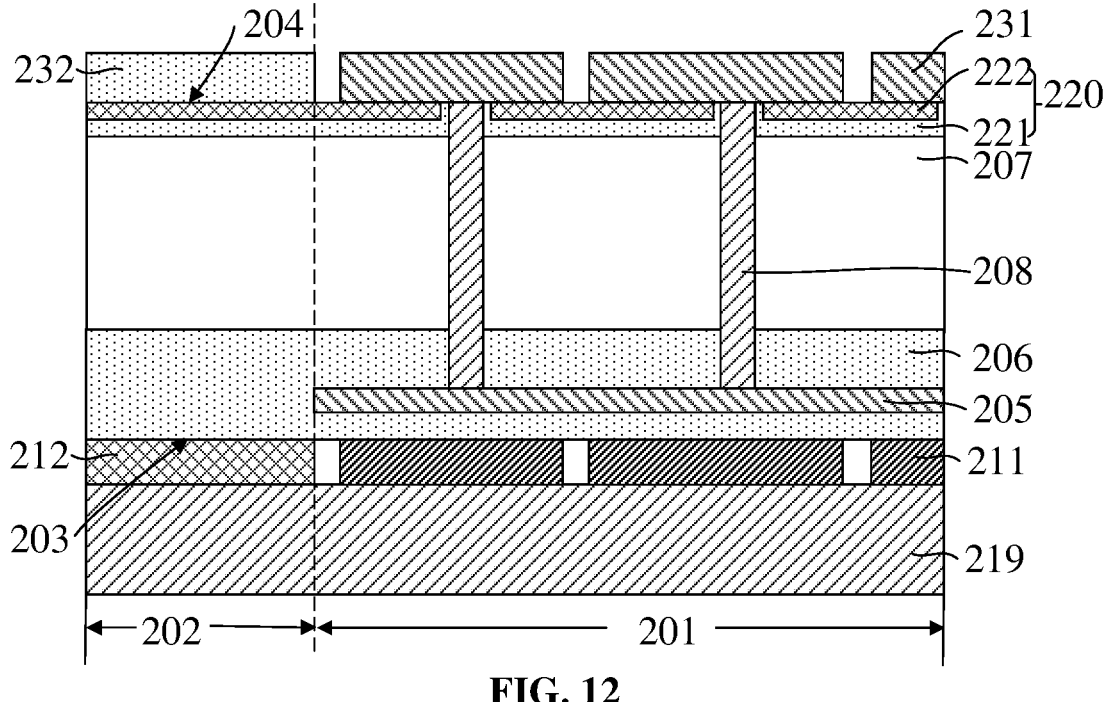
FIG. 12 illustrates a ninth sectional view corresponding to various operations in a packaging method provided by an embodiment of the disclosure.

With reference to FIG. 11 and FIG. 12, a second metal film 230 is formed on the second surface 204 of the initial semiconductor structure, and the second metal film 230 located in the circuit area 201 is patterned, where remaining portions of the second metal film 230 located in the circuit area 201 serve as a plurality of third metal layers 231, and the second metal film 230 located in the support area 202 serves as a fourth metal layer 232.

Specifically, with reference to FIG. 11, a second metal film 230 is formed on the second surface 204 of the initial semiconductor structure.

In some embodiments, the material of the second metal film 230 may be the same as the material of the first metal film 210. In some other embodiments, the material of the second metal film may be different from the material of the first metal film.

With reference to FIG. 12, a second mask layer is formed on the second metal film 230; and the second metal film 230 located in the circuit area 201 is etched by taking the second mask layer as a mask, to form a plurality of third metal layers 231 spaced apart from each other, where the second metal film 230 located in the support area 202 serves as a fourth metal layer 232. The second mask layer is removed.

In some embodiments, the semiconductor structure includes a plurality of third metal layers 231 spaced apart from each other. In the arrangement direction of the support area 202 and the circuit area 201, the ratio of the spacing between any adjacent third metal layers 231 of the plurality of third metal layers 231 to the width of each of the plurality of third metal layers 231 is the same as the ratio of the spacing between any adjacent first metal layers 211 of the plurality of first metal layers 211 to the width of each of the plurality of first metal layers 211, specifically, ⅙, ½, or ⅗.

Specifically, in the arrangement direction of the support area 202 and the circuit area 201, the width of each of the plurality of third metal layers 231 is the same as the width of each of the plurality of first metal layers 211, specifically, 45 µm, 50 µm, or 55 µm. The spacing between any adjacent third metal layers 231 of the plurality of third metal layers 231 is the same as the spacing between any adjacent first metal layers 211 of the plurality of first metal layers 211, specifically 10 µm, 15 µm, 20 µm, or 25 µm.

In some embodiments, the fourth metal layer 232 located in the support area 202 is an entire continuous film layer. In one aspect, this ensures that a supporting effect is achieved between two semiconductor structures that are stacked onto one another; and in the other aspect, the content proportion of the fourth metal layer 212 to the semiconductor structure is relatively large, which facilitates promoting the heat dissipation of the integrated circuit and further improving the stability of the integrated circuit.

Figure 13:
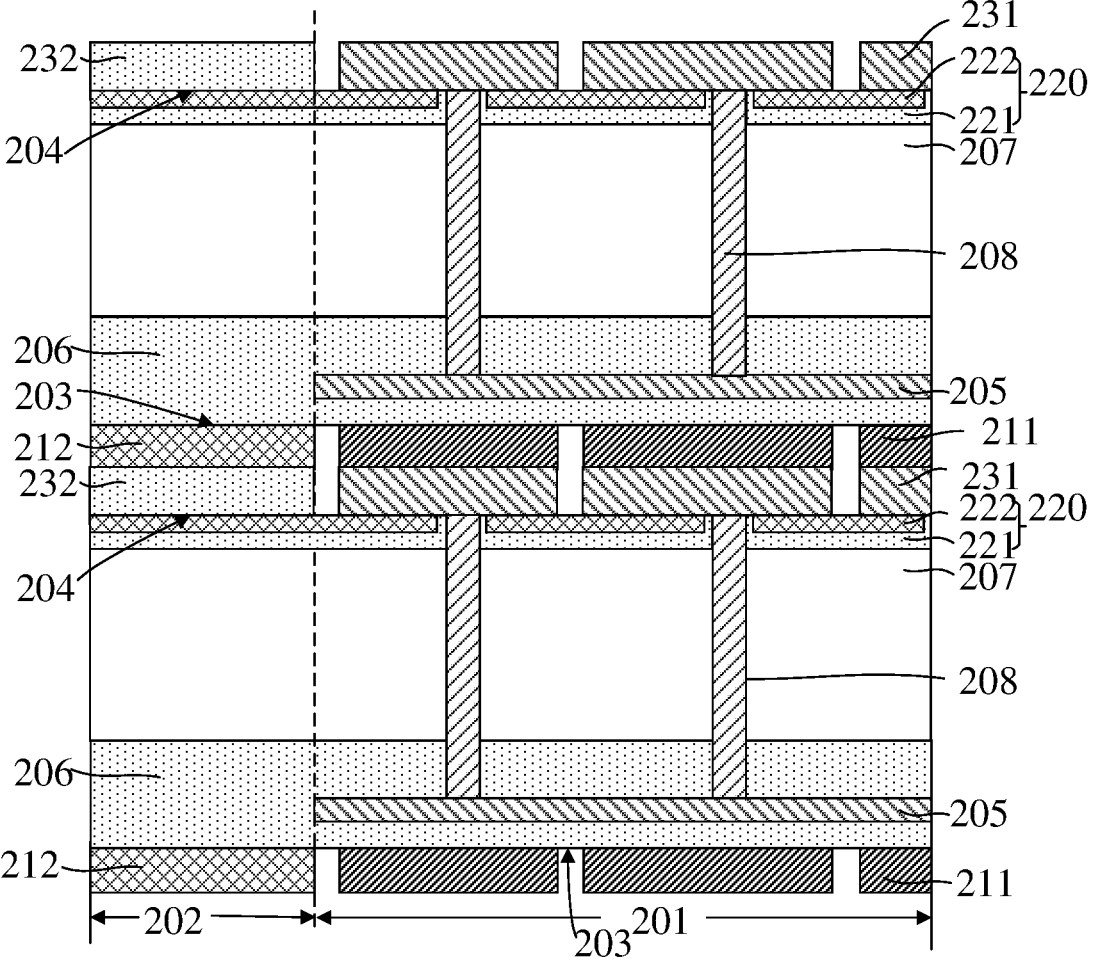
FIG. 13 illustrates a tenth sectional view corresponding to various operations in a packaging method provided by an embodiment of the disclosure.

With reference to FIG. 13, bonding treatment is performed on the at least two semiconductor structures, so that the first surface 203 of one semiconductor structure of the at least two semiconductor structures directly faces toward the second surface 204 of another semiconductor structure of the at least two semiconductor structures which is adjacent to said one semiconductor structure; the first metal layer 211 of said one semiconductor structure is in contact with and bonded to the third metal layer 231 of said another semiconductor structure adjacent to said one semiconductor structure; and the second metal layer 212 of said one semiconductor structure is in contact with and bonded to the fourth metal layer 232 of said another semiconductor structure adjacent to said one semiconductor structure.

In some embodiments, an orthographic projection of each third metal layer 231 on the first surface 203 is located within an orthographic projection of the respective first metal layer 211 that is in contact with and bonded to each third metal layer 231 on the first surface 203. The size of the orthographic projection of each third metal layer 231 on the first surface 203 is the same as the size of the orthographic projection of the respective first metal layer 211 that is in contact with and bonded to each third metal layer 231 on the first surface 203. That is, each first metal layer 211 directly faces toward each third metal layer 231, which ensures that each of the area of the first metal layer 211 and the area of the third metal layer 231 is maximized, and facilitates improving the thermal problem of the integrated circuit.

In some other embodiments, the orthographic projection of each third metal layer on the first surface is located within the orthographic projection of the respective first metal layer that is in contact with and bonded to each third metal layer on the first surface, and the orthographic projection of each third metal layer on the first surface is less than the orthographic projection of the respective first metal layer that is in contact with and bonded to each third metal layer on the first surface.

In some embodiments, the orthographic projection of the fourth metal layer 232 on the first surface 203 is located within the orthographic projection of the second metal layer 212 that is in contact with and bonded to the fourth metal layer 232 on the first surface 203, and the size of the orthographic projection of the fourth metal layer 232 on the first surface 203 is the same as the size of the orthographic projection of the second metal layer 212 that is in contact with and bonded to the fourth metal layer 232 on the first surface 232. That is, each second metal layer 212 directly faces toward each fourth metal layer 232, which ensures each of the area of the second metal layer 212 and the area of the fourth metal layer 232 is maximized, and facilitates improving the thermal problem of the integrated circuit.

In some other embodiments, the orthographic projection of the fourth metal layer on the first surface is located within the orthographic projection of the second metal layer that is in contact with and bonded to the fourth metal layer on the first surface, and the orthographic projection of the fourth metal layer on the first surface is less than the orthographic projection of the second metal layer that is in contact with and bonded to the fourth metal layer on the first surface.

In some embodiments, the process parameters for the bonding treatment include that: the process temperature for the bonding treatment ranges from 300° C. to 400° C., specifically 300° C., 350° C., or 400° C.; and the process pressure for the bonding treatment ranges from 2.5 MPa to 150 MPa, specifically, 10 MPa, 80 MPa, or 130 MPa.

Those skilled in the art can understand that the above-mentioned implementation modes are specific embodiments to implement the disclosure. In practical application, various changes can be made in forms and details without departing from the spirit and scope of the disclosure. Any person skilled in the art can make changes and modifications without departing from the spirit and scope of the disclosure, so the scope of protection of the disclosure shall be subject to the scope defined in the claims.

What is claimed is:

1. A package structure, comprising:

at least two semiconductor structures that are stacked onto one another, each of the at least two semiconductor structures comprising a first surface and a second surface that are opposite to each other, each of the at least two semiconductor structures comprising a circuit area and a support area, and at least one conductive structure being disposed in the circuit area in each of the at least two semiconductor structures; each of the at least two semiconductor structures further comprising:

at least one first metal layer and a second metal layer, the at least one first metal layer being located on the first surface in the circuit area, and the second metal layer being located on the first surface in the support area;

at least one third metal layer and a fourth metal layer, the at least one third metal layer being located on the second surface in the circuit area and being electrically connected to the at least one conductive structure, and the fourth metal layer being located on the second surface in the support area, wherein the first surface of one semiconductor structure of the at least two semiconductor structures that are stacked onto one another directly faces toward the second surface of another semiconductor structure of the at least two semiconductor structures which is adjacent to said one semiconductor structure; the at least one first metal layer of said one semiconductor structure is contact with and bonded to the at least one third metal layer of said another semiconductor structure adjacent to said one semiconductor structure; and the second metal layer of said one semiconductor structure is in contact with and bonded to the fourth metal layer of said another semiconductor structure adjacent to said one semiconductor structure; and the at least one conductive structure protrudes from the second surface in the circuit area; each of the at least two semiconductor structures further comprises an insulating layer; the insulating layer is located on the second surface in the circuit area; the insulating layer is located on side surfaces of the at least one conductive structure; and the at least one third metal layer is located on a surface of the insulating layer.

2. The package structure of claim 1, wherein the second metal layer located in the support area is an entire continuous film layer; and the fourth metal layer located in the support area is an entire continuous film layer.

3. The package structure of claim 1, wherein each of the at least two semiconductor structure comprises a plurality of first metal layers spaced apart from each other; and in an arrangement direction of the support area and the circuit area, a ratio of a spacing between any adjacent first metal layers of the plurality of first metal layers to a width of each of the plurality of first metal layers ranges from $\frac{1}{12}$ to $\frac{3}{4}$.

4. The package structure of claim 3, wherein in the arrangement direction of the support area and the circuit area, the width of each of the plurality of first metal layers ranges from 40 $\mu$m to 60 $\mu$m.

5. The package structure of claim 3, wherein in the arrangement direction of the support area and the circuit area, the spacing between the any adjacent first metal layers of the plurality of first metal layers ranges from 5 $\mu$m to 30 $\mu$m.

6. The package structure of claim 1, wherein an orthographic projection of the at least one third metal layer on the first surface is located within an orthographic projection of the at least one first metal layer that is in contact with and bonded to the at least one third metal layer on the first surface.

7. The package structure of claim 1, wherein a material of the at least one first metal layer is the same as a material of the second metal layer.

8. The package structure of claim 1, wherein a material of the at least one first metal layer includes copper, aluminum, or tungsten.

9. The package structure of claim 1, wherein in a direction from the first surface to the second surface, a thickness of the at least one first metal layer is the same as a thickness of the at least one third metal layer.

10. The package structure of claim 1, wherein in a direction from the first surface to the second surface, a thickness of the at least one first metal layer ranges from 1 $\mu$m to 100 $\mu$m.

11. The package structure of claim 1, wherein the insulating layer comprises:

a first dielectric layer, the first dielectric layer being located on the second surface in the circuit area, and the first dielectric layer being located on a side surface of the at least one conductive structure; and a second dielectric layer, the second dielectric layer being located between the first dielectric layer and the at least one third metal layer.

* * * * *